United States Patent
Wang et al.

(10) Patent No.: US 6,500,739 B1
(45) Date of Patent: Dec. 31, 2002

(54) FORMATION OF AN INDIUM RETROGRADE PROFILE VIA ANTIMONY ION IMPLANTATION TO IMPROVE NMOS SHORT CHANNEL EFFECT

(75) Inventors: Howard Chih-Hao Wang, Hsin-chu (TW); Su-Yu Lu, Hsinchu (TW); Mu-Chi Chiang, Hsinchu (TW); Carlos H. Diaz, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/880,260

(22) Filed: Jun. 14, 2001

(51) Int. Cl.$^7$ ............................................. H01L 21/425
(52) U.S. Cl. ....................... 438/514; 438/513; 438/525; 438/528; 438/305; 438/286
(58) Field of Search ................... 438/514, 530, 438/300, 224, 200, 513, 286, 433, 525, 308, 369, 528, 775, 776, 305

(56) References Cited

U.S. PATENT DOCUMENTS

| | | | |
|---|---|---|---|
| 5,650,340 A | 7/1997 | Burr et al. | 437/30 |
| 5,923,987 A | 7/1999 | Burr | 438/304 |
| 5,970,353 A * | 10/1999 | Sultan | 438/302 |
| 5,976,937 A | 11/1999 | Rodder et al. | 438/275 |
| 5,985,727 A | 11/1999 | Burr | 438/302 |
| 6,051,458 A | 4/2000 | Liang et al. | 438/224 |
| 6,063,682 A * | 5/2000 | Sultan et al. | 438/305 |
| 6,110,783 A | 8/2000 | Burr | 438/286 |
| 6,194,293 B1 * | 2/2001 | Krivokapic | 438/525 |

* cited by examiner

*Primary Examiner*—Caridad Everhart
*Assistant Examiner*—Igwe U. Anya
(74) *Attorney, Agent, or Firm*—George O. Saile; Stephen B. Ackerman

(57) ABSTRACT

A method of forming a pocket implant region, to reduce short channel effects (SCE), for narrow channel length, NMOS devices, has been developed. After forming an indium pocket implant region, in the area of a P type semiconductor to be used to accommodate an N type source/drain region, an ion implantation procedure is used to place antimony ions in the indium pocket implant region. The presence of antimony ions limits the broadening of the indium pocket implant profile during subsequent anneal procedures, used to activate implanted ions. Formation of an implanted, lightly doped, N type source/drain region, insulator spacers on the sides of a gate structure, and formation of a heavily doped, N type, source/drain region, complete the process sequence used to form the NMOS, transfer gate transistor.

16 Claims, 4 Drawing Sheets

FORMATION OF AN INDIUM RETROGRADE PROFILE VIA ANTIMONY ION IMPLANTATION TO IMPROVE NMOS SHORT CHANNEL EFFECT

BACKGROUND OF THE INVENTION (1) Field of the Invention

This present invention relates to methods used to fabricate semiconductor devices, and more specifically to a method used to form an anti-punch through, pocket region, for an N channel, metal oxide semiconductor (NMOS), device.

(2) Description of Prior Art

As the dimensions of metal oxide semiconductor field effect transistor (MOSFET), devices decrease, short channel effects (SCE), become more prevalent. For example the spreading of a source/drain—substrate depletion region, located at one end of a narrow channel length region, can approach the adjacent, source/drain—substrate depletion region, located at the other end of the narrow channel length region, resulting in unwanted leakage or punch through. In addition a threshold voltage (Vt), roll-off phenomena, featuring decreased Vt values with decreasing channel length, for a specific set of parameters such as gate dielectric thickness, channel doping, etc., can deleteriously influence the parametrics of narrow channel length devices.

One solution for the SCE phenomena has been the use of a pocket, or halo region, formed with the same conductivity type as the semiconductor substrate, but formed at a higher dopant concentration than the semiconductor substrate, in an area under the source/drain region. The pocket region limits the extent of the source/drain—substrate depletion region, and thus decreases unwanted leakages and possible punch through phenomena. In addition the unwanted Vt roll-off phenomena, prevalent with narrow channel length devices, is reduced when the implanted pocket regions are implemented. Pocket implant regions are usually accomplished in specific portions of a P type, semiconductor via implantation of P type ions, such as boron or indium. However the diffusivity of these P type ions can result in unwanted broadened, pocket region profiles, negated some of the benefits supplied by the pocket regions, when used for narrow channel length devices. This invention will describe a method of forming an indium pocket region for a narrow channel length device, however featuring a process step needed to confine the pocket implant profile, thus reducing the risk of punch through leakage, and Vt roll-off, for narrow channel length devices. Prior art, such Burr et al, in U.S. Pat. No. 5,650,340, as well as Burr et al, in U.S. Pat. No. 6,110,783, show methods of forming implanted pocket regions, however these prior arts do not describe the combination of process sequences used in this present invention, needed to form an implanted pocket region, with a confined profile, needed for narrow channel length, MOSFET devices.

SUMMARY OF THE INVENTION

It is an object of this invention to fabricate a NMOS device, featuring a narrow channel length region.

It is another object of this invention to form an indium pocket implant region, under the source/drain region of the NMOS device, to reduce SCE such as punch through leakage, and Vt roll-off.

It is still another object of this invention to place implanted antimony ions, into the indium pocket implant region, to confine the indium pocket profile.

In accordance with the present invention a method of fabricating a narrow channel length region, NMOS device, featuring an indium pocket implant region located under a source/drain region, and comprised with implanted antimony placed in the indium pocket n to restrict the broadening of the indium pocket profile, is described. After formation of a gate structure, on an underlying gate insulator layer, a first ion implantation procedure is used to place indium ions, in regions of a P type, semiconductor substrate, not covered by the gate structure. A second ion implantation procedure is next performed placing antimony ions into the same region of the P type semiconductor substrate, followed by a third ion implantation procedure, used for implantation of a first group of arsenic ions. Formation of insulator spacers on the sides of the gate structure, is followed by a fourth ion implantation procedure, placing a second group of arsenic ions, at a greater dopant concentration than the first set of arsenic ions, in a region of the P type semiconductor substrate not covered by the gate structure or by the insulator spacers. A subsequent anneal procedure activates the implanted ions and results in a profile of a lightly doped source/drain (LDD), region, comprised with the first set of arsenic ions, confined in a pocket implant region, comprised of indium ions, and featuring antimony ions located in the pocket implant region. The multi-component profile is located in, and confined to, a region in the P type semiconductor substrate not covered by the gate structure, or consumed by a heavily doped source/drain region, which in turn is comprised with the second set of arsenic ions, located in a region of the P type semiconductor substrate, not covered by the gate structure, or by the insulator spaces located on the sides of the gate structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
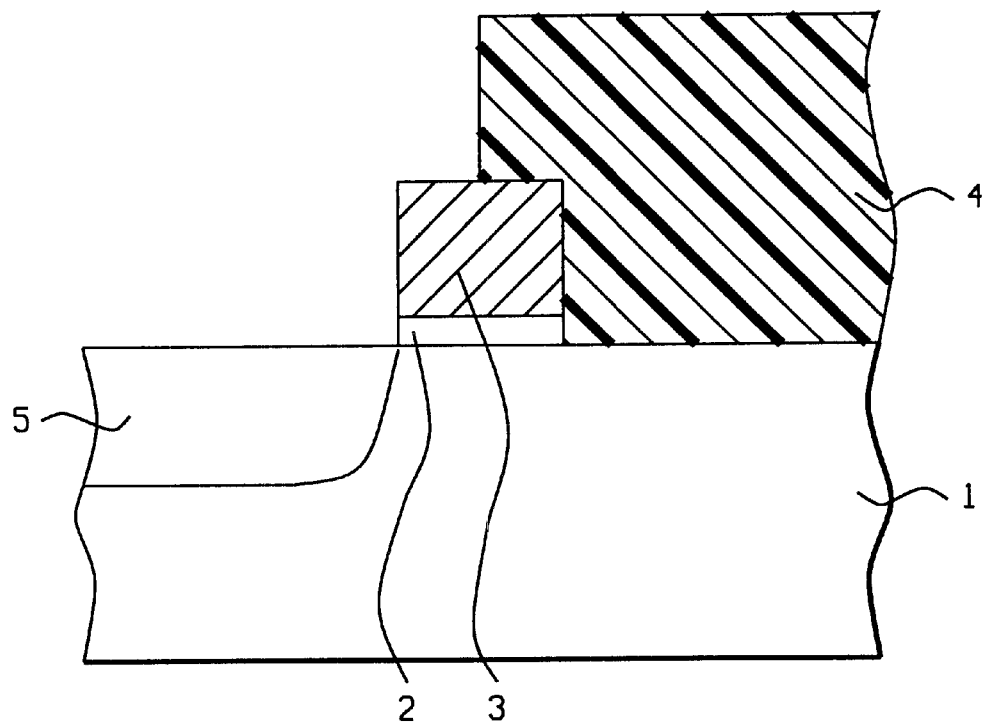
FIGS. 1–5, which schematically, in cross-sectional style, describe key stages used to fabricate a narrow channel length region, NMOS device, featuring implanted antimony ions used to restrict the broadening of the indium pocket profile.

The method of forming a narrow channel length, NMOS device, featuring an indium pocket region, comprised with implanted antimony ions, used to confine the indium pocket profile, will now be described in detail. A P type semiconductor substrate 1, comprised of P type, single crystalline silicon, with a <100> crystallographic orientation, and with a resistivity between about 8 to 12 ohm-cm, is used and schematically shown in FIG. 1. Gate insulator layer 2, comprised of silicon dioxide is thermally grown, in an oxygen-steam ambient, to a thickness between about 13 to 70 Angstroms. A conductive layer, such as a doped polysilicon layer, is next deposited via low pressure chemical vapour deposition (LPCVD), procedures, at a thickness between about 1000 to 2500 Angstroms. The polysilicon layer can be in situ doped during deposition via the addition of arsine or phosphine to a silane ambient, or the polysilicon layer can be deposited intrinsically then doped via implantation of arsenic or phosphorous ions. If desired the conductive layer can be a polycide layer, comprised of an overlying metal silicide layer such as tungsten silicide, and an underlying doped polysilicon layer. Conventional photolithographic and anisotropic reactive ion etching procedures, are next used to define gate structure 3, schematically shown in FIG. 1. Removal of the photoresist shape, used for definition of the gate structure, is accomplished via plasma oxygen ashing and careful wet cleans.

The initiation of the multi-component profile, used to create the LDD region, the pocket implant region, and the antimony contribution needed for profile confinement, is next addressed. In some cases an asymmetric device is desired, featuring the pocket implant region only located under either the source, or the drain region, of the NMOS device. For the asymmetrical device photoresist shape 4, is used as a mask to protect either the source or the drain side from the implantation procedure used for indium pocket region 5. This is shown schematically in FIG. 1. Indium is implanted at an energy between about 30 to 130 KeV, at a dose between about 5E12 to 5E14 atoms/cm$^2$. The implant dose used will result in an indium pocket region 5, greater in P type dopant concentration than the dopant concentration of P type semiconductor substrate 1. If the asymmetrical device is implemented, prior to removal of photoresist shape 4, the novel antimony, ion implantation procedure is performed. After implantation of antimony ions, photoresist shape 4, is removed using plasma oxygen ashing and careful wet cleans, followed by the formation of the LDD regions, on both sides of the gate structure, in regions of the semiconductor substrate not covered by gate structure 3. The use of the antimony ion implantation procedure, for the asymmetric device, contained only in the pocket region located under either a source or drain region, is not shown in FIG. 1, but will be illustrated in detail for a symmetrical NMOS device, using FIGS. 2–5.

Figure 2:
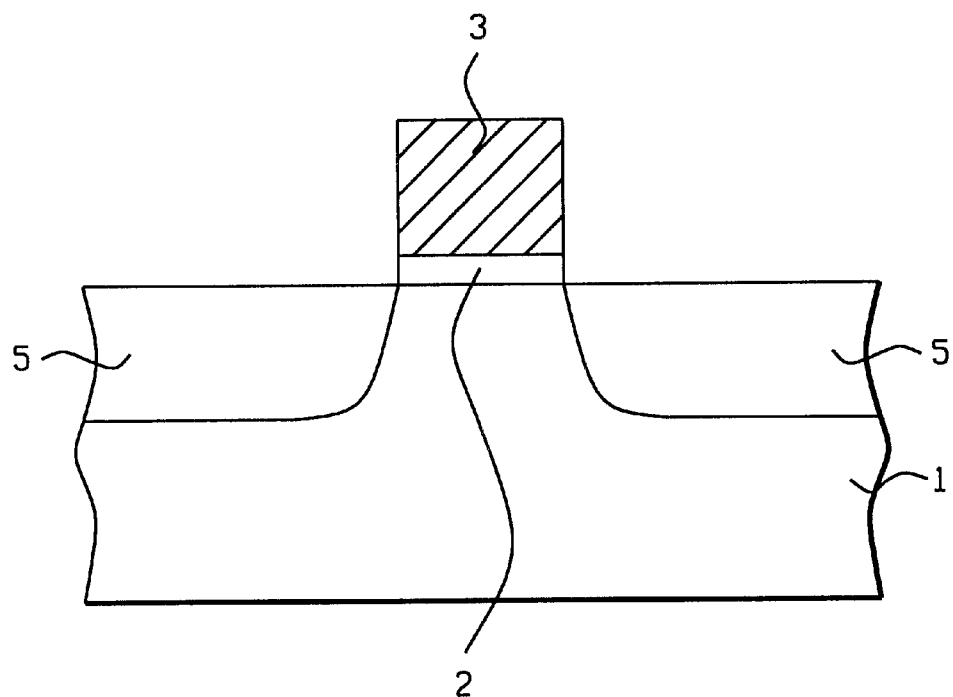
Figure 3:
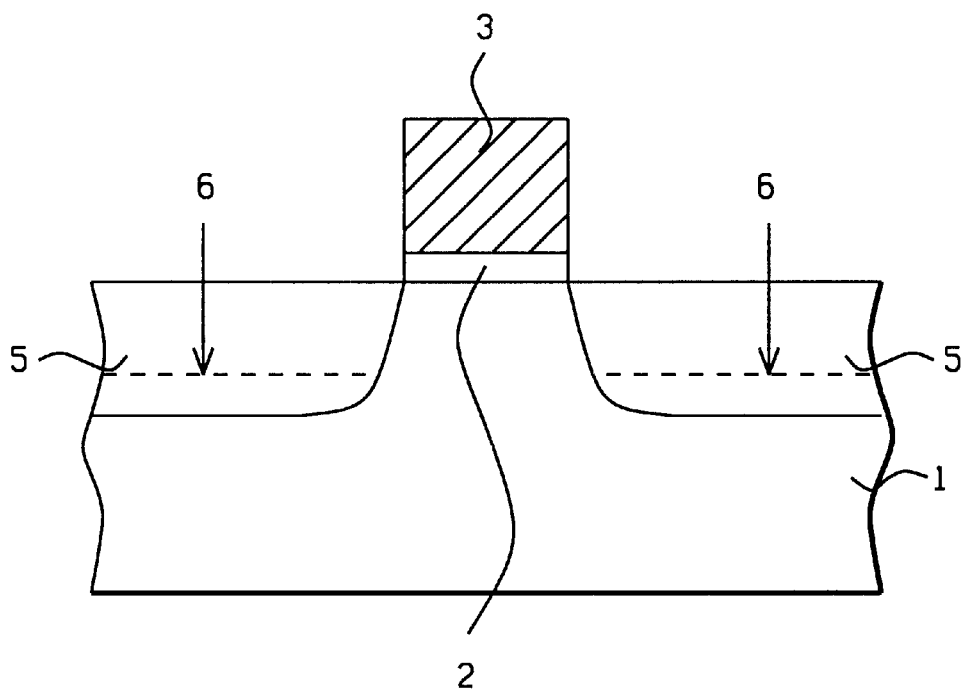

The creation of indium pocket regions 5, for a symmetrical NMOS device, to be located under both a source and under a drain region, of a NMOS device, is shown schematically in FIG. 2. After removal of the photoresist shape used for definition of gate structure 3, indium ions are again implanted at an energy between about 30 to 130 KeV, at a dose between about 5E12 to 5E14 atoms/cm$^2$, in portions of semiconductor substrate 1, not covered by gate structure 3. The P type dopant concentration of indium pocket region 5, is again greater than the dopant concentration of semiconductor substrate 1. The objective of the indium pocket region, with a specific dopant concentration, is to limit the extent of the depletion region formed between the source/drain—substrate regions. The higher dopant concentration of the indium pocket, compared to the dopant concentration of the P type semiconductor substrate, does limit the extent of the depletion region, however during subsequent process steps, such as the deposition of the insulator spacer layer, or source/drain anneal cycles, performed at elevated temperatures, the profile of the indium pocket region can broaden, resulting in less depletion region limiting characteristics, therefore a process used to reduce the broadening of the indium pocket region profile, via implantation of antimony ions, is introduced. After the first implantation procedure featuring indium ions, a second implantation procedure, featuring antimony ions 6, at a energy between about 20 to 100 KeV, at a dose between about 3E13 to 3E14 atoms/cm$^2$, is performed. Antimony ions 6, schematically shown in FIG. 3, placed in indium pocket regions 5, located on both sides of gate structure 3, will restrict the broadening of indium pocket region 5. The ability of antimony ions 6, to confine or restrict indium pocket regions 5, is a result of the interaction between antimony and indium.

Figure 4:
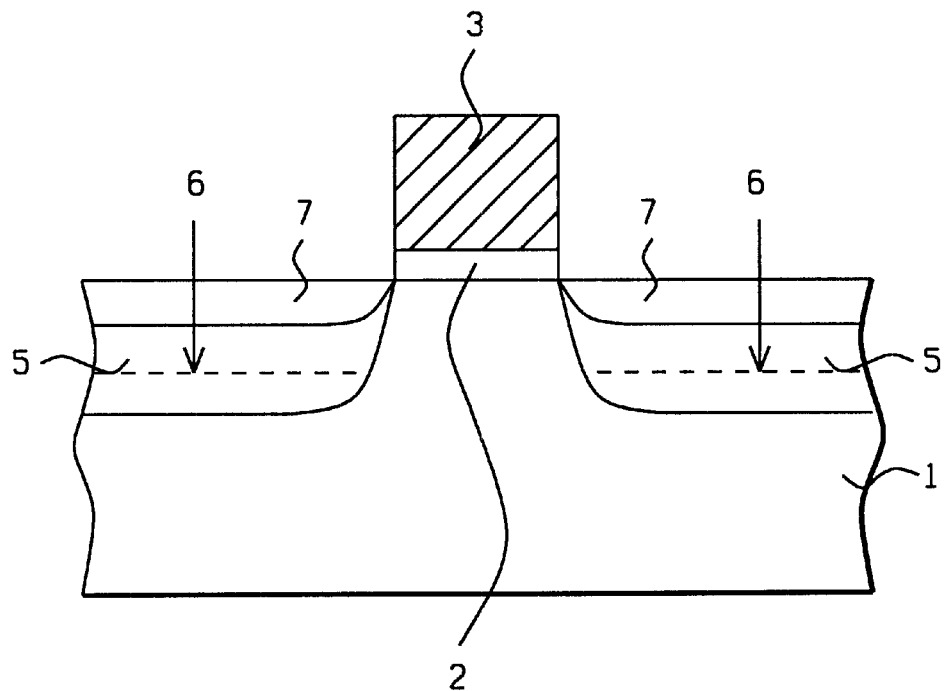

A third ion implantation procedure used to create LDD or arsenic extension regions 7, is next addressed and schematically shown in FIG. 4. Implantation of arsenic ions, at an energy between about 1 to 10 KeV, and at a dose between about 3E14 to 2E15 atoms/cm$^2$, create LDD region 7, in top portions of indium pocket regions 5, in areas of semiconductor substrate 1, not covered by gate structure 3. At this point an anneal procedure, used to activate the indium ions, the antimony ions, and the arsenic ions, is performed at a temperature between about 850 to 1050° C., in an inert ambient such as nitrogen or argon, using either conventional furnace procedures, or using a rapid thermal anneal procedure. The activation anneal procedure, would have resulted in unwanted broadening of the indium pocket profile, if antimony had not been previously introduced, leading to unwanted device parametric characteristics. If desired the anneal procedure can be delayed to a point in the fabrication sequence in which a fourth ion implantation procedure, used to create a heavily doped source/drain region, had already been performed.

Figure 5:
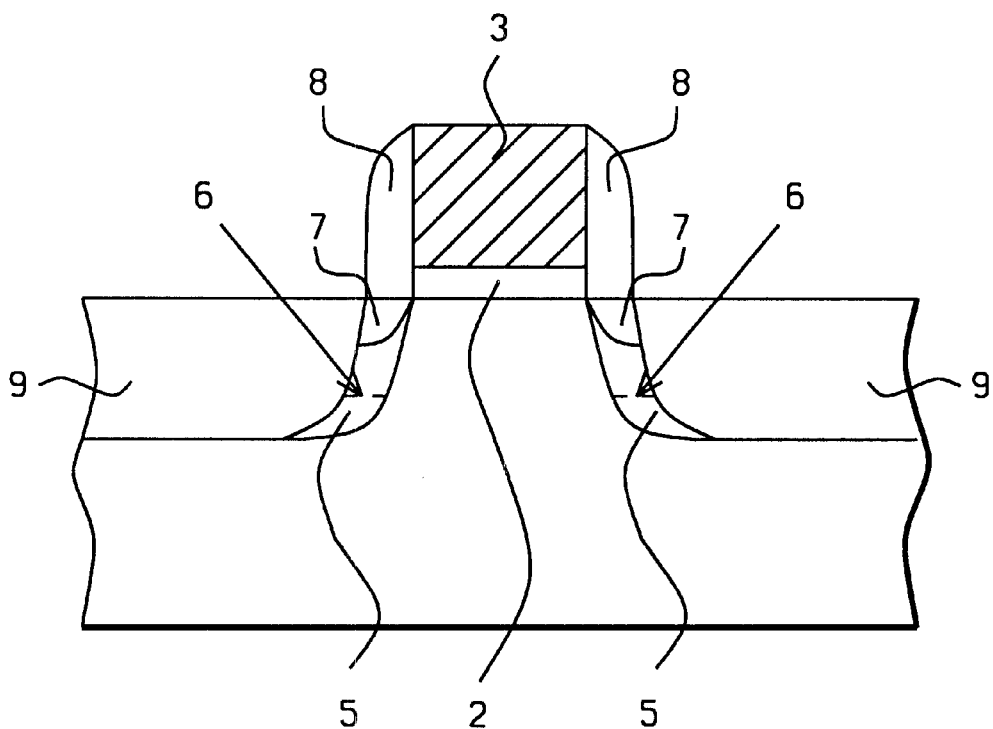

An insulator layer such as silicon oxide, or silicon nitride, is next deposited via LPCVD or via plasma enhanced chemical vapour deposition (PECVD), procedures, at a thickness between about 400 to 800 Angstroms. The deposition temperature of the insulator layer, between about 500 to 750° C., would result in activation of the indium, antimony, and arsenic ions, located in the multi-component profile, if the post—heavily doped source/drain region anneal option were to be used. An anisotropic reactive ion etching procedure, using CHF$_3$ as an etchant for the insulator layer, is used to define insulator spacers 8, located on the sides of gate structure 3. This is schematically shown in FIG. 5. A fourth ion implantation procedure is next performed, using arsenic, or phosphorous ions, at an energy between about 20 to 80 KeV, at a dose between about 1E15 to 8E15 atoms/cm$^2$, resulting in the formation of heavily doped source/drain region 9, in areas of semiconductor substrate 1, not covered by gate structure 3, or by insulator spacers 8. This is also illustrated schematically in FIG. 5. A post heavily doped source/drain anneal procedure can now be performed, if not previously performed post LDD implantation. The anneal procedure would be performed at a temperature between about 1000 to 1100° C., in an inert ambient, again using either conventional furnace or rapid thermal anneal furnace procedures. Again the desired profile of indium pocket region 5, would have been broadened during the anneal cycle, if antimony region 6, had not been used.

Figure 6:
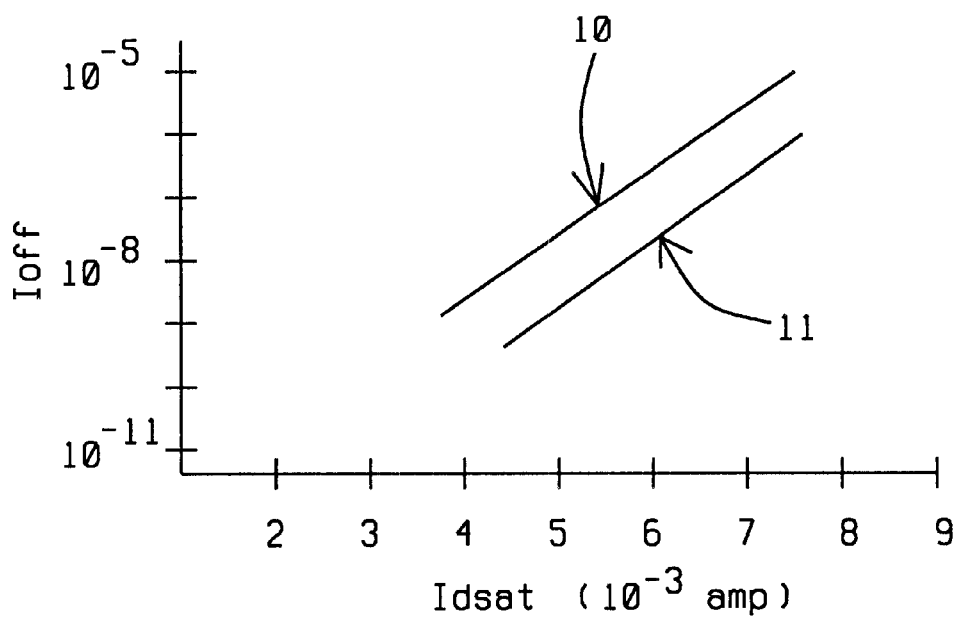
FIGS. 6–7, which graphically illustrate the improved punch through and Vt roll-off characteristics obtained via use of indium pocket implant regions, featuring implanted antimony ions, when compared to counterparts fabricated without the implanted antimony procedure.
Figure 7:
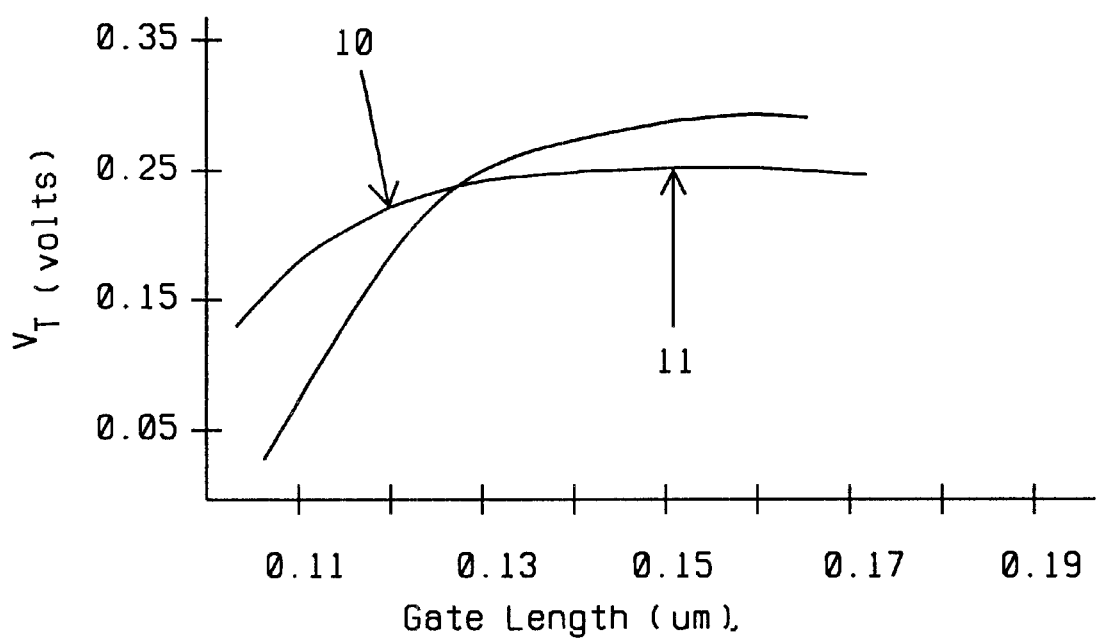

Specific device characteristics, obtained with and without the addition of antimony to the multi-component, NMOS profile, are illustrated in FIGS. 6–7. The relationship between the current flowing during a device off situation, current (Ioff), as a function of drain current, (Idsat), a level of punch through type leakage, is illustrated for devices 11, formed using implanted antimony, and for devices 10, formed without incorporating antimony. It can be seen in FIG. 6, that a reduction of leakage current (Ioff), is accomplished via use of the antimony implantation procedure, which in turns restricted broadening of the indium pocket profile, limiting the extent of the depletion region. In addition FIG. 7, clearly shows undesirable Vt roll-off, at narrow gate lengths for non-antimony devices 10, while NMOS devices, formed with an indium pocket region, incorporating antimony, resulted in insignificant Vt roll-off, even at the narrowest channel regions.

While this invention has been particularly shown and described with reference to, the preferred embodiments thereof, it will be understood by those skilled in the art that various changes in form and details may be made without departing from the spirit and scope of this invention.

What is claimed is:

1. A method of forming an N channel, metal oxide semiconductor (NMOS), device, on a semiconductor substrate, comprising the steps of:

providing a gate structure, overlying a gate insulator layer, on a semiconductor substrate comprised with a first conductivity type dopant;

performing a first ion implantation procedure to form a pocket implant region, of a first conductivity type, in a region of said semiconductor substrate not covered by said gate structure;

performing a second ion implantation procedure to place antimony ions in said pocket implant region;

performing a third ion implantation procedure to form a lightly doped source/drain (LDD), region, of a second conductivity type, in an area of said semiconductor substrate not covered by said gate structure, with said LDD region located in a top portion of said pocket implant region;

performing an anneal procedure to activate antimony ions in said pocket implant region, to activate ions used to form said pocket implant region, and to activate the ions in said LDD region;

forming insulator spacers on sides of said gate structure; and performing a fourth ion implantation procedure to from a heavily doped source/drain region, of a second conductivity type, in a region of said semiconductor substrate not covered by said gate structure, and not covered by insulator spacers on sides of said gate structure.

2. The method of claim 1, wherein said gate insulator layer is a silicon dioxide layer obtained via thermal oxidation procedures at a thickness between about 13 to 70 Angstroms.

3. The method of claim 1, wherein said pocket implant region, of said first conductivity type, is comprised of indium ions, obtained via said first ion implantation procedure, wherein indium ions are implanted at an energy between about 30 to 130 KeV, at a dose between about 5E12 to 5E14 atoms/cm$^2$.

4. The method of claim 1, wherein said antimony ions are placed in said pocket implant region via said second ion implantation procedure, performed at an energy between about 20 to 100 KeV, at a dose between about 3E13 to 3E14 atoms/cm$^2$.

5. The method of claim 1, wherein said LDD region, of said second conductivity type, is comprised of arsenic ions, obtained via said third ion implantation procedure, performed at an energy between about 1 to 10 KeV, at a dose between about 3E14 to 2E15 atoms/cm$^2$.

6. The method of claim 1, wherein said anneal procedure, used to activate said antimony ions, said pocket implant regions ions, and said LDD region ions, is performed using conventional furnace, or rapid thermal anneal procedures, at a temperature between about 850 to 1050° C., in an inert ambient.

7. The method of claim 1, wherein said insulator spacers are comprised of silicon oxide, or silicon nitride, at a thickness between about 400 to 800 Angstroms, formed via deposition of a silicon oxide or a silicon nitride layer, via LPCVD or PECVD procedures, at a temperature between about 500 to 750° C., then defined via an anisotropic reactive ion etching procedure, using $CHF_3$ as an etchant.

8. The method of claim 1, wherein said heavily doped source/drain region, of a second conductivity type, is comprised of arsenic or phosphorous ions, obtained via said fourth ion implantation procedure, performed at an energy between about 20 to 80 KeV, at a dose between about 1E15 to 8E15 atoms/cm$^2$.

9. A method of fabricating an NMOS device, on a P type semiconductor substrate, featuring the addition of antimony to a pocket implant region, to reduce broadening of the pocket implant region profile during subsequent anneal procedures, comprising the steps of:

providing a gate structure on an underlying gate insulator layer, on said P type semiconductor substrate;

performing a first ion implantation procedure, using indium ions, to form an indium pocket implant region in an area of said P type semiconductor substrate not covered by said gate structure;

performing a second ion implantation procedure to place antimony ions in said indium pocket implant region;

performing a third ion implantation procedure to form an N type, LDD region in an area of said P type semiconductor substrate not covered by said gate structure, with said N type, LDD region located in a top portion of said indium pocket implant region;

performing an anneal procedure to activate indium ions, in said indium pocket implant region, to activate said antimony ions located in said indium pocket implant region, and to activate N type ions located in said N type, LDD region;

forming insulator spacers on sides of said gate structure; and performing a fourth ion implantation procedure to form a heavily doped, N type source/drain region, in an area of said P type semiconductor substrate not covered by said gate structure or by said insulator spacers.

10. The method of claim 9, wherein said gate insulator layer is a silicon dioxide layer obtained via thermal oxidation procedures at a thickness between about 13 to 70 Angstroms.

11. The method of claim 9, wherein said indium pocket implant region is obtained via said first ion implantation procedure, wherein said indium ions are implanted at an energy between about 30 to 130 KeV, at a dose between about 5E12 to 5E14 atoms/cm$^2$.

12. The method of claim 9, wherein said antimony ions are placed in said indium pocket implant region via said second ion implantation procedure, performed at an energy between about 20 to 100 KeV, at a dose between about 3E13 to 3E14 atoms/cm$^2$.

13. The method of claim 9, wherein said N type, LDD region, is formed from arsenic ions, obtained via said third ion implantation procedure, performed at an energy between about 1 to 10 KeV, at a dose between about 3E14 to 2E15 atoms/cm$^2$.

14. The method of claim 9, wherein said anneal procedure, used to activate said indium ions, said antimony ions, and said N type ions, of said N type, LDD region ions, is performed using conventional furnace, or rapid thermal anneal procedures, at a temperature between about 850 to 1050° C., in an inert ambient.

15. The method of claim 9, wherein said insulator spacers are comprised of silicon oxide, or silicon nitride, at a thickness between about 400 to 800 Angstroms, formed via deposition of a silicon oxide or a silicon nitride layer, via LPCVD or PECVD procedures, at a temperature between about 500 to 750° C., then defined via an anisotropic reactive ion etching procedure, using $CHF_3$ as an etchant.

16. The method of claim 9, wherein said heavily doped, N type source/drain region, is formed with arsenic or phosphorous ions, obtained via said fourth ion implantation procedure, performed at an energy between about 20 to 80 KeV, at a dose between about 1E15 to 8E15 atoms/cm$^2$.

* * * * *